United States Patent [19]
Sukigara et al.

[11] Patent Number: 6,149,736
[45] Date of Patent: Nov. 21, 2000

[54] MAGNETOSTRUCTURE MATERIAL, AND PROCESS FOR PRODUCING THE SAME

[75] Inventors: Tooru Sukigara; Jun Takizawa; Hitoshi Itami, all of Saitama, Japan

[73] Assignee: Honda Giken Kogyo Kabushiki Kaisha, Tokyo, Japan

[21] Appl. No.: 08/894,245

[22] PCT Filed: Dec. 5, 1996

[86] PCT No.: PCT/JP96/03563

§ 371 Date: Mar. 6, 1998

§ 102(e) Date: Mar. 6, 1998

[87] PCT Pub. No.: WO97/20960

PCT Pub. Date: Jun. 12, 1997

[30] Foreign Application Priority Data

Dec. 5, 1995 [JP] Japan .................................. 7-344449
Dec. 5, 1996 [JP] Japan .................................. 8-340631

[51] Int. Cl.⁷ ...................................................... H01F 1/053
[52] U.S. Cl. ........................ 148/301; 148/101; 148/122
[58] Field of Search ................................... 148/101, 102, 148/122, 301, 302, 303, 103

[56] References Cited

U.S. PATENT DOCUMENTS

| | | | |
|---|---|---|---|
| 4,075,042 | 2/1978 | Das | 148/103 |
| 5,201,962 | 4/1993 | Yamashita et al. | 148/101 |
| 5,834,663 | 11/1998 | Fukuno et al. | 75/244 |
| 5,888,417 | 3/1999 | Akioka et al. | 252/262.55 |

FOREIGN PATENT DOCUMENTS

| | | |
|---|---|---|
| 61-64851 | 4/1986 | Japan . |
| 1-246342 | of 1989 | Japan . |
| 2-129316 | 5/1990 | Japan . |
| 3-35260 | of 1991 | Japan . |
| 4-196106 | 7/1992 | Japan . |
| 6-58445 | of 1994 | Japan . |

OTHER PUBLICATIONS

Chemical Abstracts, vol. 88, No. 24, Jun. 12, 1978, "Liquid Phase Sintering Of Rare Earth–Iron . . . Magnetostrictive Materials" No. XP002109147.

Chemical Abstracts, vol. 88, No. 18, May 1, 1978 "Microstructure and Magnetoacoustic Oscillations in Cobalt–Doped Copper, Nickel Ferrite", XP002109148.

Database WPI, Section PQ, Week 9438, Derwent Publications, Ltd., XP002109149 May 15, 1993.

Database WPI, Section Ch, Week 8216, Derwent Publications, Ltd., XP002109150 Jun. 23, 1981.

European Search Report Applications No. EP 96 94 1178 Jul. 14, 1999.

*Primary Examiner*—John Sheehan
*Attorney, Agent, or Firm*—Lyon & Lyon LLP

[57] ABSTRACT

A magnetostrictive material includes a rare earth element and a transition metal element, and has a plurality of spherical voids dispersed in the entire area thereof. The void content Vc is set in a range of $10\% \leq Vc \leq 40\%$. Thus, it is possible to provide a magnetostrictive material having a practical mechanical strength and a substantially increased magnetostriction amount.

17 Claims, 9 Drawing Sheets

Example 3

100 μm

MAGNETOSTRUCTURE MATERIAL, AND PROCESS FOR PRODUCING THE SAME

BACKGROUND OF THE INVENTION

1. Field of the Invention

The present invention relates to a magnetostrictive material, and particularly, to a magnetostrictive material including a rare earth element and a transition metal element, and a process for producing the same.

2. Description of the Related Art

This type of magnetostrictive material is conventionally known as disclosed in, for example, Japanese Patent Application Laid-open No.1-246342.

However, the known magnetostrictive material suffers from a problem that when a magnetic field is applied thereto, this material is deformed, with its volume remaining substantially constant, in a direction of the magnetic field due to the fact that the density is set at approximately 100% with respect to a theoretical density in order to make its mechanical strength high, and hence, the magnetostriction amount is relatively small.

The magnetostrictive material is used for forming a fuel injection valve in an engine for an automobile, as disclosed in, for example, Japanese Utility Model Application Laid-open No.3-35260 and Japanese Patent Application Laid-open No.6-58445. The mechanical strength required for the fuel injection valve or he like may be relatively low and hence, it is required that the magnetostrictive material used for the fuel injection valve or the like have only a practical mechanical strength and moreover, have a larger magnetostriction amount.

Accordingly, it is an object of the present invention to provide a magnetostrictive material which has a practical mechanical strength and also has a substantially increased magnetostriction amount.

SUMMARY OF THE INVENTION

To achieve the above object, according to the present invention, there is provided a magnetostrictive material including a rare earth element and a transition metal element, wherein the magnetostrictive material has a plurality of spherical voids dispersed in an entire volume thereof, a void content Vc being in a range of $10\% \leq Vc \leq 40\%$. The spherical voids may include a plurality of voids connected together into an elongated configuration.

If the magnetostrictive material is formed into a porous configuration, so that it has a void content Vc falling in the above range, the deforming ability of the magnetostrictive material is increased as compared with that of a high-density magnetostrictive material. Thus, it is possible to increase the magnetostriction amount of the magnetostrictive material.

When the magnetostrictive material is used, for example, as a material for forming a fuel injection valve of an engine in an automobile, the practical mechanical strength required for the magnetostrictive material can be satisfied by setting the void content Vc in the above-described range.

However, if the void content Vc<5%, the strength is increased, but the magnetostriction amount is decreased. On the other hand, if the void content Vc>40%, both the strength and the magnetostriction amount are decreased. In such range of the void content Vc, the magnetostrictive material having the spherical voids has a higher strength and a larger magnetostriction amount than those of a magnetostrictive material having flake-like voids.

It is another object of the present invention to provide a producing process of the above-described type, which is capable of easily producing a porous magnetostrictive material of the above-described type.

To achieve the above object, according to the present invention, there is provided a process for producing a magnetostrictive material, comprising the steps of producing by casting a blank including a transition metal element and an excessive amount of Sm larger than a final amount of Sm, and subjecting the blank to a thermal treatment in which an extra amount of Sm is removed to form a plurality of spherical voids.

With this process, it is possible to easily produce a porous magnetostrictive material of the above-described type.

DESCRIPTION OF THE PREFERRED EMBODIMENTS OF THE INVENTION

A magnetostrictive material includes a rare earth element and a transition metal element, and has a plurality of spherical voids dispersed in the entire volume thereof. The void content Vc is set in a range of $10\% \leq Vc \leq 40\%$.

At least one element selected from Sm, Pr, Yb and the like corresponds to the rare earth element, and at least one element selected from Fe, Ni, Co and the like corresponds to the transition metal element.

The magnetostrictive material formed in the above manner has a large magnetostriction amount, for example, of 700 ppm or more and a compression strength, for example, of 10 kgf/mm$^2$ or more. This is effective for a material for forming the fuel injection valve.

If a plurality of phases of a rare earth element, e.g., phases of Sm, are dispersed in the entire magnetostrictive material, and the sum total T of contents of Sm forming the Sm phases is set in a range of 0.1 atom $\% \leq T \leq 1.3$ atom %, the flexure strength of the magnetostrictive material can be enhanced up to 1 to 5 kgf/mm$^2$. This is also effective for the material for forming the fuel injection valve. However, if T<0.1 atom %, the flexure strength is lowered. On the other hand, if T>1.3 atom %, the magnetostriction amount is lowered. The porous magnetostrictive material of the above-described type, for example, the magnetostrictive material including Sm as the rare earth element is produced in the following described process.

A blank containing a transition metal element and an excessive amount of Sm larger than the final amount of Sm is subjected to a casting and then to a thermal treatment. In the thermal treating step, the excessive amount of Sm is removed by evaporation and/or elution to form a plurality of spherical voids.

For example, in producing a magnetostrictive material including a phase or phases of $SmFe_2$ (an intermetallic compound which will be referred to as IMC hereinafter), a blank is used which is basically comprised of a plurality of phases of Sm simple and at least one phase of $SmFe_2$. In this case, the blank may include at least one of at least one phase of $SmFe_3$ (IMC) and at least one phase of $Sm_2Fe_{17}$ (IMC).

Figure 1:
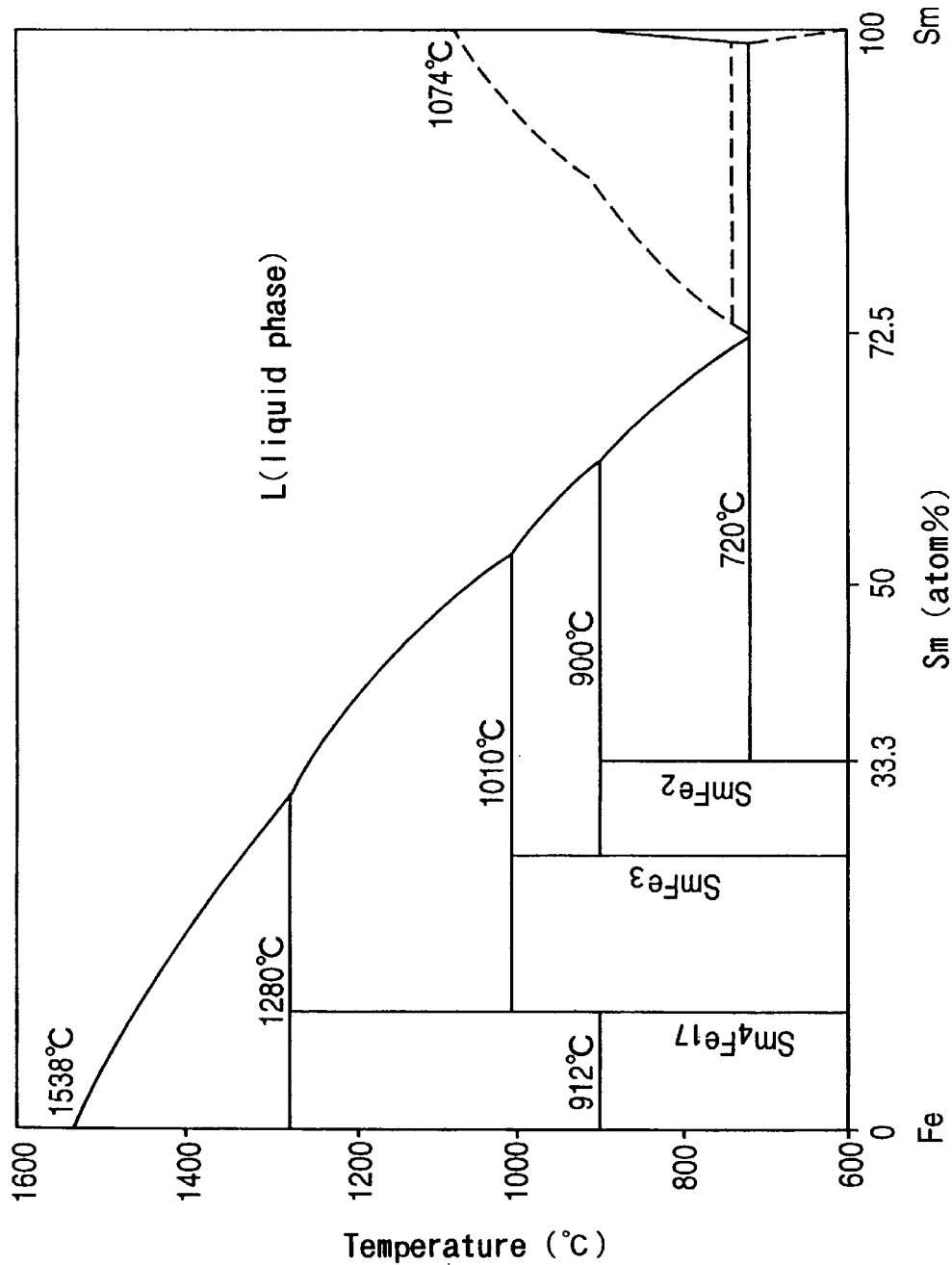
FIG. 1 is an Sm—Fe based binary equilibrium state diagram.
Figure 2:
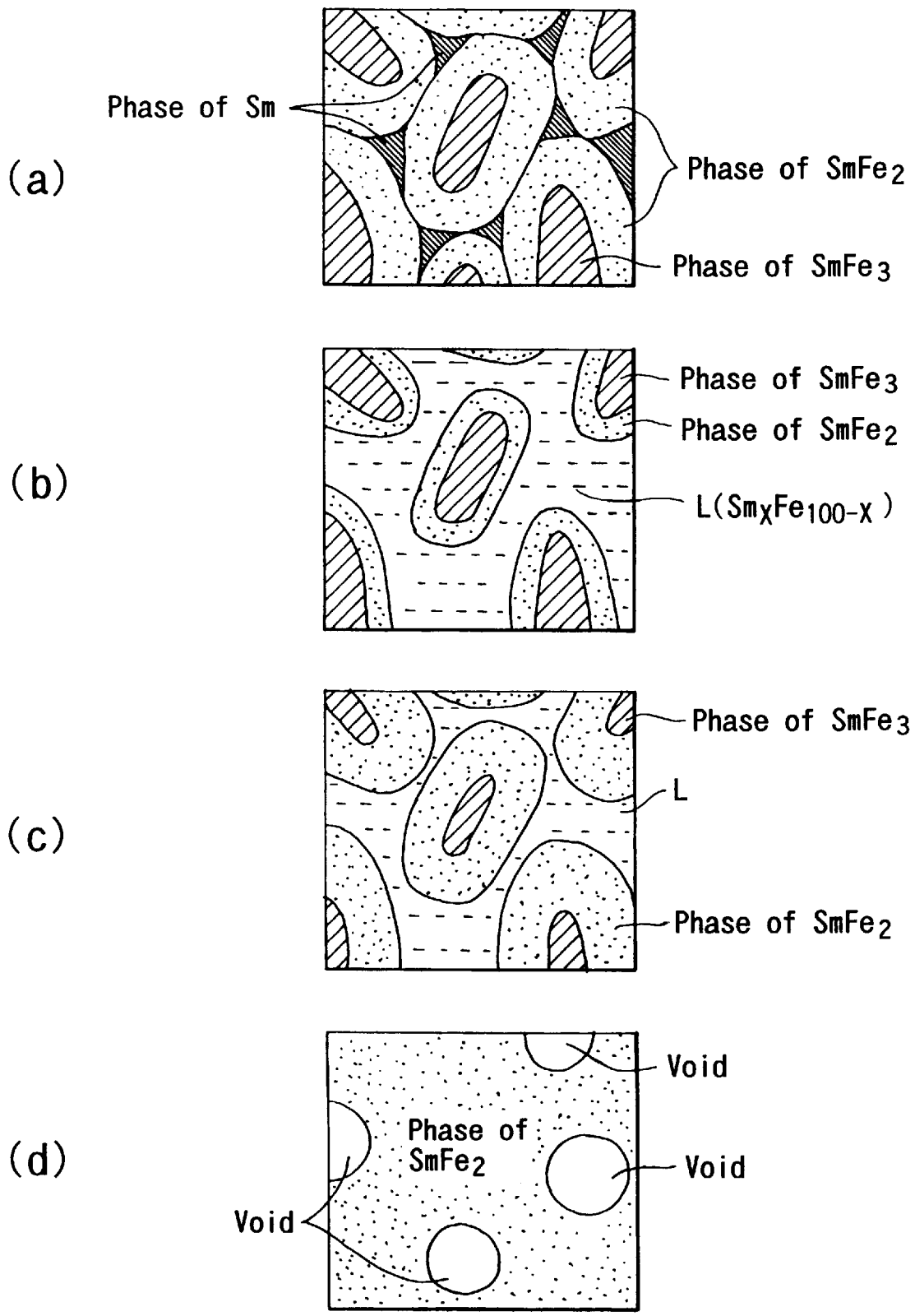
FIGS. 2(a), 2(b), 2(c) and 2(d) are diagrammatic illustrations showing the progression of variations in the microstructure of a blank.

In the magnetostrictive material comprised of the phase (S) of $SmFe_2$, the content of Sm is equal to or smaller than 33.3 atom % ($Sm \leq 33.3$ atom %) as is apparent from an Sm—Fe based binary equilibrium state diagram in FIG. 1, and hence, the content of Sm in the blank is set in a range of $Sm > 33.3$ atom %.

It is desirable to use a casting mold which has a thermal capacity enabling the cooling rate down to the 700° C. to be controlled to 100–1000° C./min during solidification of a molten metal in order to prevent a cracking due to a thermal shrinkage. It is also desirable that the atmosphere at the melting and casting steps is under a depressurization (including a vacuum) and/or in an inert gas.

The temperature in the thermal treatment is required to be lower than a peritectic temperature (900° C. in FIG. 1) of the magnetostrictive material. This is because the phase of $SmFe_2$ which is a magnetostrictive phase is decomposed at a temperature equal to or higher than the peritectic temperature. The temperature increasing rate is equal to or higher than 100° C./hr, preferably, 100–6,000° C./hr; the treatment time is equal to or larger than 1 hour, preferably, 3 to 6 hours; and the cooling rate is equal to or lower than 400° C./min. The thermal treatment is carried out by rectilinearly increasing the temperature up to a predetermined temperature and maintaining that temperature for a predetermined time. In some cases, measures in the thermal treatment may be employed for repeating the temperature increasing and dropping steps a plurality of times, for stepwise increasing the temperature, and for dividing the treatment time into a plurality of times.

In the thermal treatment, first, a liquid phase of Sm is partially produced and then, the evaporation and/or elution of Sm is produced. Therefore, the atmosphere in the thermal treatment is maintained under a depressurization of $1 \times 10^{-2}$ Torr or less to control the amount of Sm evaporated and the like and thus, the void content Vc. In this case, an inert gas may be included in the atmosphere. To assist in the removal of the liquid phase out of the blank, a measure may be employed which involves winding a mesh of metal or ceramics around the blank, or bringing a metal or ceramic powder, preferably, an $Al_2O_3$ powder into contact with the blank to produce a capillary phenomenon.

The change of the microstructure of the blank due to the thermal treatment will be described below with reference to FIG. 2 comprising FIGS. 2(a), 2(b), 2(c) and 2(d), showing the steps of changing of the microstructure of the blank and FIG. 3 which is a Sm—Fe based binary non-equilibrium state diagram (a dashed line indicates an equilibrium state).

FIG. 2(a) illustrates a non-equilibrium solidified microstructure which is comprised of three phases: a phase of Sm, a phase of $SmFe_2$ and a phase of $SmFe_3$, wherein the phase of $SmFe_2$ exists around each of the plurality of phases of $SmFe_3$, and the phase of Sm fills the space between adjacent phases of $SmFe_2$. This microstructure is indicated, for example, by a point a in the Sm—Fe based binary non-equilibrium state diagram in FIG. 3. If such non-equilibrium solidified microstructure is subjected to a thermal treatment at 800° C., the metal Sm is first evaporated so that the composition is changed into a composition having a high concentration of Fe and then, the microstructure is changed into an equilibrium state, with the passage of time. Such course advances in the following described manner.

Figure 3:
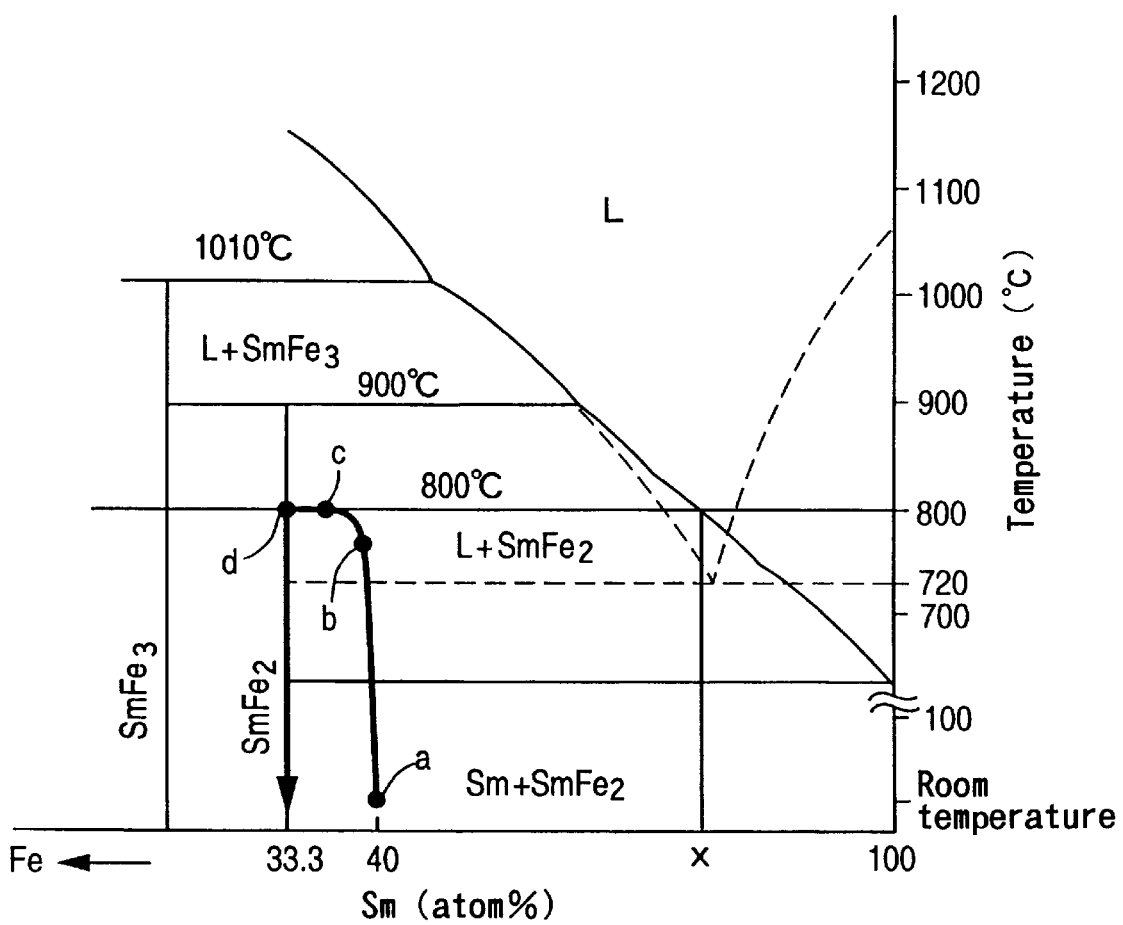
FIG. 3 is an Sm—Fe based binary non-equilibrium state diagram.

First, if the temperature of the non-equilibrium solidified microstructure is raised from the point a in FIG. 3 up to a point b exceeding an eutectic temperature (720° C.), the non-equilibrium phase produces, at near the eutectic temperature, a reaction which is represented by the following reaction formula:

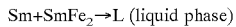

Sm+SmFe$_2$→L (liquid phase)

Namely, the phases of $SmFe_2$ react sequentially from their surfaces, whereby the phases of $SmFe_2$ are decreased and a liquid phase L is produced around the phases of $SmFe_2$, as shown in FIG. 2(b). However, the composition of the liquid phase L is comprised of x atom % of Sm and (100–x) atom % of Fe, wherein x is in a range of 33.3 atom % $\leq x \leq 100$ atom %, and is a value corresponding to a liquid phase line of 800° C. in the non-equilibrium state diagram in FIG. 3.

If the temperature is further raised to approach 800° C., the evaporation of Sm becomes active, but the evaporation is preferentially produced from the liquid phase L which has a thermodynamically high concentration of Sm and moreover, has a larger diffusion coefficient.

If the temperature reaches 800° C., as shown by a point c in FIG. 3, Sm is subsequently evaporated from the liquid phase L, and Sm in the liquid phase L is diffused through grain boundaries of the phases of $SmFe_2$ into the phases of $SmFe_3$. Therefore, a reaction represented by the following reaction formula is produced:

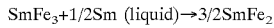

SmFe$_3$+1/2Sm (liquid)→3/2SmFe$_2$

The composition of the liquid phase L is changed from $Sm_xFe_{100-x}$ into a composition having a higher concentration of Fe due to the evaporation of Sm from the liquid phase L, but a phase equilibrium is maintained. Therefore, phases of $SmFe_2$ are grown by the production of non-uniform nuclei about a center provided by a solid-liquid boundary face. That is, the phases of $SmFe_2$ are grown in an inner area (on the side of $SmFe_3$) and also in an outer area (on the side of the liquid phase) as shown in FIG. 2(c).

When the $SmFe_3$ disappears in a state in which the treatment temperature is maintained at 800° C., a reaction represented by a reaction formula is produced, and an extra amount of Sm is evaporated.

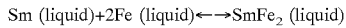

Sm (liquid)+2Fe (liquid)←→SmFe$_2$ (liquid)

At a location indicated by a point d in FIG. 3, the extra amount of Sm in the liquid phase L does not exist. By cooling this composition, a magnetostrictive material dispersing a plurality of spherical voids in phases of $SmFe_2$ as shown in FIG. 2(d) is produced. These voids are formed by the evaporation of the extra amount of Sm.

EXAMPLE I

A. Production of Magnetostrictive Material

Five blanks were produced through a step of placing a starting material into a high-frequency melting furnace to melt the starting material in an atmosphere of argon (Ar) under depressurization (–60 cmHg) and maintaining the molten metal at 1,400° C. for 5 minutes for homogenization, a step of pouring the molten metal into a casting mold made of copper in an atmosphere of argon (Ar), and a step of cooling the molten metal down to 700° C. at 400° C./min. Each of the blanks was covered by a powder of $Al_2O_3$ and subjected to a thermal treatment in a predetermined atmosphere under conditions of a temperature increasing rate of 400° C./hr, a treatment temperature of 800° C., a treatment time of 6 hours and then cooling at a cooling rate of 100° C./hr, thereby producing five blanks of magnetostrictive material.

For a comparison, three portions of a magnetostrictive material powder having a particle size of 100 μm or less were subjected to a mono-axial compression molding using a metal mold with a molding pressure set at 5.05–7.64 ton/cm² to form three green compacts. Then, each of the green compacts was subjected to a sintering treatment in an atmosphere of vacuum under conditions of a temperature increasing rate of 400° C./hr, a treatment temperature of 900° C., a treatment time of 6 hours and then cooling at a cooling rate of 100° C./hr, thereby producing three blanks of magnetostrictive material.

Table 1 shows the composition of the blank, the thermal treating atmosphere and the composition of the magnetostrictive material for each of examples 1 to 5 of the magnetostrictive materials produced using blanks in the casting manner, as well as the sintering atmosphere and the composition (magnetostrictive material) for examples 7 to 9 of the magnetostrictive material produced in the sintering manner. (there is no example 6)

TABLE 1

| Magnetostrictive material | | Composition of blank (atom %) | Thermal treating atmosphere | Sintering atmosphere | Composition of magnetostrictive material (atom %) |
|---|---|---|---|---|---|
| Example | 1 | $Sm_{38}Fe_{62}$ | Ar under 1 atmospheric pressure | — | $Sm_{33}Fe_{67}$ |
|  | 2 | $Sm_{38}Fe_{62}$ | Ar under $1 \times 10^{-2}$ Torr | — | $Sm_{33}Fe_{67}$ |
|  | 3 | $Sm_{40}Fe_{60}$ | $5 \times 10^{-5}$ Torr | — | $Sm_{33}Fe_{67}$ |
|  | 4 | $Sm_{39}Pr_1Fe_{60}$ | $5 \times 10^{-5}$ Torr | — | $Sm_{32}Pr_1Fe_{67}$ |
|  | 5 | $Sm_{37}Fe_{63}$ | $5 \times 10^{-5}$ Torr | — | $Sm_{33}Fe_{67}$ |
| Example | 7 | — | — | $5 \times 10^{-5}$ Torr | $Sm_{32}Yb_1Fe_{67}$ |
|  | 8 | — | — | $5 \times 10^{-5}$ Torr | $Sm_{32}Yb_1Fe_{67}$ |
|  | 9 | — | — | $5 \times 10^{-5}$ Torr | $Sm_{32}Yb_1Fe_{67}$ |

B. Measurement of Void Content Vc, Magnetostriction Amount and Mechanical Properties Each of the examples 1 to 5 and 7 to 9 were measured for the void content Vc, the magnetostriction amount, the compression strength and the Young's modulus of elasticity, and results given in Table 2 were obtained. The void content Vc was determined from the observation by an electron microscope and from the density. The magnetostriction amount was measured using a strain gauge with a magnetic field applied at 1 kOe. Further, the compression strength and the Young's modulus of elasticity were measured in a usual process.

TABLE 2

| Magnetostrictive material | | Void content Vc (%) | Magnetostriction amount (ppm) | Compression strength (kgf/mm²) | Young's Modulus of elasticity (kgf/mm²) |
|---|---|---|---|---|---|
| Example (cast and thermally treated) | 1 | 5 | 600 | 24.7 | 3900 |
|  | 2 | 10.3 | 803 | 20.5 | 3150 |
|  | 3 | 33 | 870 | 18 | 2200 |
|  | 4 | 37 | 875 | 17.5 | 2000 |
|  | 5 | 40 | 800 | 17 | 1800 |
| Example (sintered) | 7 | 35.1 | 670 | 13.5 | 2100 |
|  | 8 | 38.1 | 610 | 12.2 | 1900 |
|  | 9 | 46.9 | 500 | 6.8 | 1600 |

Figure 4A:
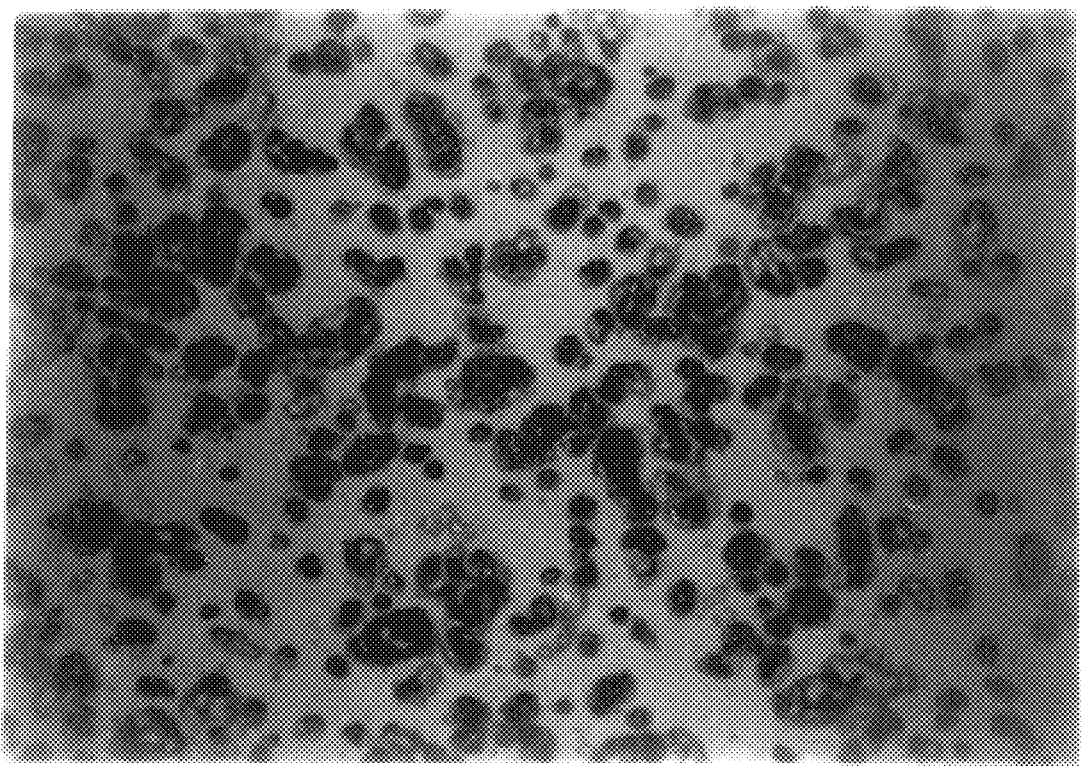
FIG. 4A is a photomicrograph showing the metallographic structure of a magnetostrictive material.
Figure 4B:
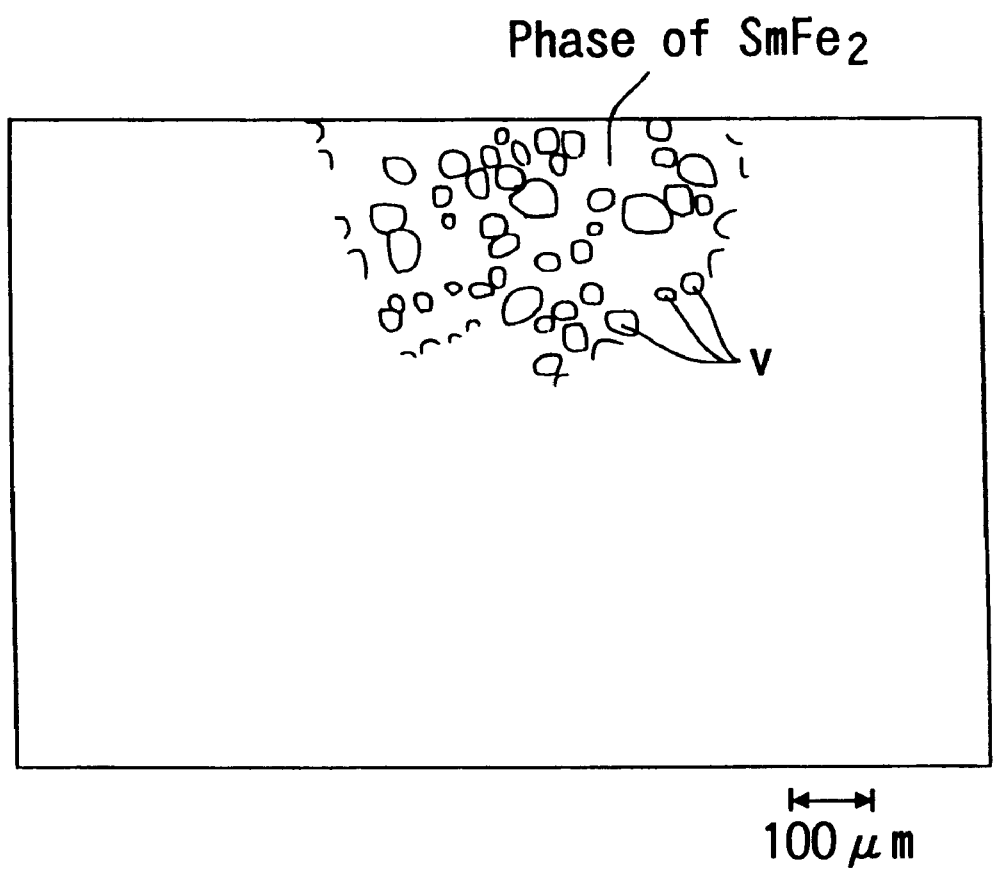
FIG. 4B is a tracing of an essential portion of the photomicrograph shown in FIG. 4A.

FIG. 4A is a photomicrography showing the metallographic structure of the example 3, and FIG. 4B is a tracing of the essential portion of the photomicrography shown in FIG. 4A. As is apparent from FIGS. 4A and 4B, it can be seen that a plurality of spherical voids v are dispersed in the phase of $SmFe_2$.

Similar spherical voids were also observed in each of the examples 1, 2, 4 and 5, but flake-like voids were observed in the examples 7 to 9 made in the sintering process.

Figure 5:
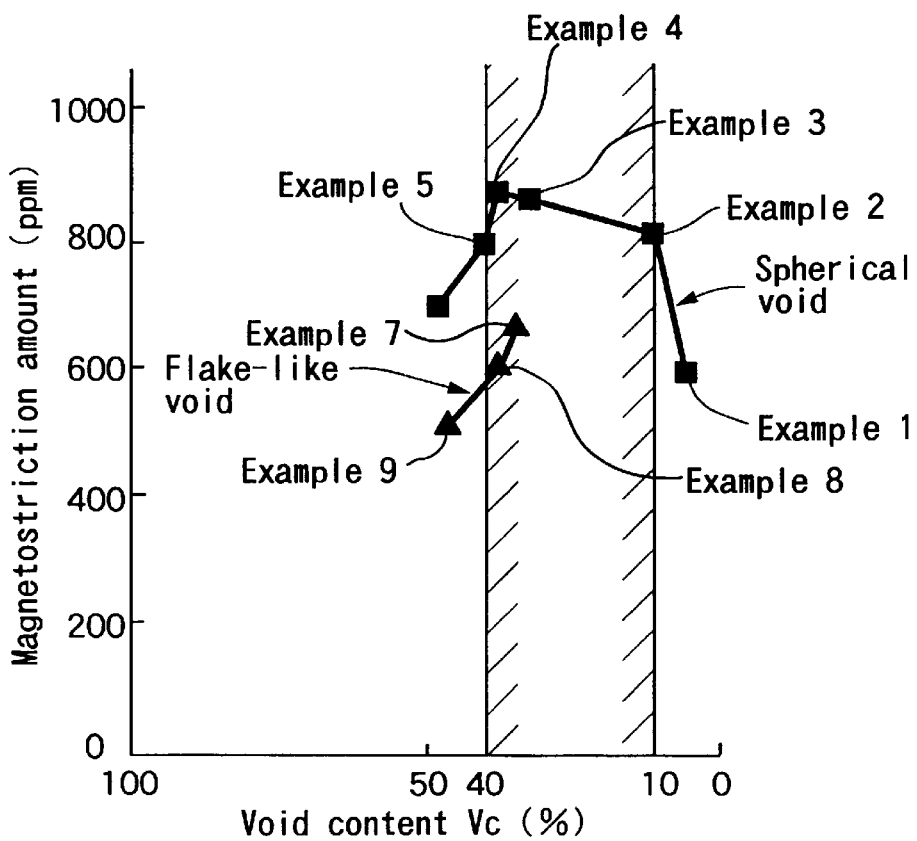
FIG. 5 is a graph illustrating the relationship between the void content Vc and the magnetostriction amount.

FIG. 5 is a graph illustrating the relationship between the void content Vc and the magnetostriction amount taken from Table 2. As is apparent from FIG. 5, if the shape of the voids is spherical and the void content Vc is set in a range of $10\% \leq Vc \leq 40\%$, as in the examples 2 to 5, the magnetostriction amount can be remarkably increased as compared with the example 1. This is attributable to the fact that when the magnetic field is applied in the examples 2 to 5, the examples 2 to 5 are deformed as the volume is decreased, while crushing the voids in a direction of the magnetic field.

If the density is set at approximately 100% with respect to the theoretical density, such as the void content Vc is equal to 5% as in the example 1, the example 1, when a magnetic field is applied, is deformed with the volume in the direction of the magnetic field being maintained substantially constant, namely, the example 1 is shrunk in the direction of the magnetic field while being expanded in a direction perpendicular to the direction of the magnetic field, resulting in a smaller magnetostriction amount.

If the examples 4 and 5 are compared with the examples 7 and 8, it can be seen that when the void contents Vc thereof are substantially equal to each other, the magnetostriction amount of the examples having the spherical voids is larger than that of the examples having the flake-like voids.

Figure 6:
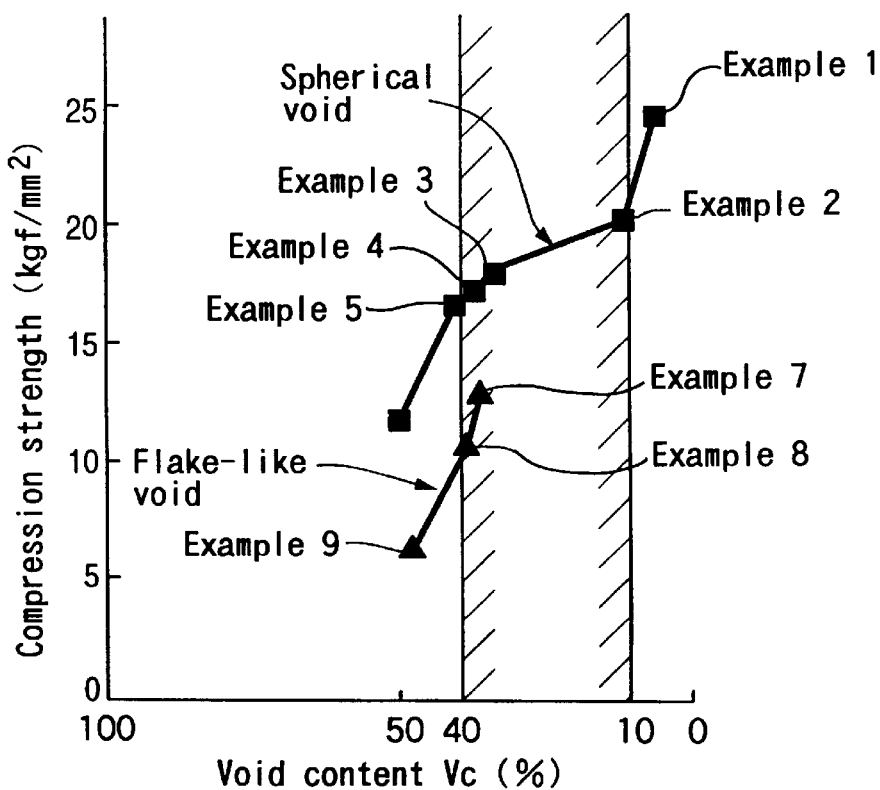
FIG. 6 is a graph illustrating the relationship between the void content Vc and the compression strength.

FIG. 6 is a graph illustrating the relationship between the void content Vc and the compression strength taken from Table 2. As is apparent from FIG. 6, if the shape of the voids is spherical and the void content Vc is set in a range of $10\% \leq Vc \leq 40\%$, as in the examples 2 to 5, the magnetostrictive material has a relatively high compression strength and is effective for the material for forming the fuel injection valve.

EXAMPLE II

A casting process similar to that in EXAMPLE I was carried out to produce four blanks having a composition of $Sm_{40}Fe_{60}$ (the unit of numerical values is atom %). Each of the blanks was subjected to a thermal treatment in a predetermined atmosphere under conditions of a temperature increasing rate of 400° C./hr, a treatment temperature of 800° C., a treatment time of 6 hours and then cooling at a cooling rate of 100° C./hr to produce examples 1 to 4 of magnetostrictive materials having a composition of $Sm_{33}Fe_{67}$ (the unit of numerical values is atom %).

The examples 1 to 4 were measured for the void content Vc and the magnetostriction amount in the same method as in EXAMPLE I.

Table 3 shows the thermally treating atmosphere, the void content Vc and the magnetostriction amount for the examples 1 to 4. The example 4 is the magnetostrictive material produced by subjecting the blank covered with by a powder of $Al_2O_3$ to the thermal treatment.

TABLE 3

| Magnetostrictive material | | Thermally treating atmosphere | Void content Vc (%) | Magnetostriction amount (ppm) |
|---|---|---|---|---|
| Example | 1 | Ar under 1 atmospheric pressure | 2 | 500 |
| | 2 | Ar under $1 \times 10^{-2}$ Torr | 10.3 | 803 |
| | 3 | under $5 \times 10^{-5}$ Torr | 22 | 830 |
| | 4 | powder of $Al_2O_3$ under $5 \times 10^{-5}$ Torr | 33 | 870 |

As is apparent from Table 3, the example 1 is the magnetostrictive material produced by the thermal treatment in the atmosphere of argon (Ar) under 1 atmospheric pressure. Therefore, the number of the voids is extremely small and the large extra amount of Sm is left, and hence, the magnetostriction amount is small. The examples 2 and 3 are the magnetostrictive material produced by the thermal treatment in the atmosphere of argon (Ar) under depressurization, or in the vacuum atmosphere. Therefore, the void content Vc is high as compared with that in the example 1 and hence, the magnetostriction amount is larger. The example 4 is the magnetostrictive material produced by the thermal treatment in the presence of the powder of $Al_2O_3$ and in the vacuum atmosphere. Therefore, the void content Vc is high as compared with those in the examples 2 and 3 due to the effect of liquid phase elution of the powder of $Al_2O_3$ and hence, the magnetostriction amount is larger.

EXAMPLE III

A casting process similar to that in EXAMPLE I was carried out to produce six blanks having the same composition. Each of the blanks was subjected to a thermal treatment in a predetermined atmosphere under conditions of a temperature increasing rate of 400° C./hr, a treatment temperature of 800° C., a treatment time of 1 to 6 hours and a cooling rate of 100° C./hr to produce examples 1 to 6 of magnetostrictive materials having various compositions. The microscopic observation showed that each of the examples 1 to 6 has a plurality of phases of Sm simple dispersed in the entire material.

Table 4 shows the composition of the blank, the atmosphere and treatment time in the thermal treatment as well as the composition of the magnetostrictive material for the examples 1 to 6. The examples 4 to 6 are the magnetostrictive materials produced by the thermal treatment of the blank covered by the $Al_2O_3$.

TABLE 4

| Magnetostrictive material | | Composition of blank (atom %) | Thermal treatment | | Composition of magnetostrictive material (atom %) | |
|---|---|---|---|---|---|---|
| | | | Atmosphere | Time (hr) | | |
| Example | 1 | $Sm_{40}Fe_{60}$ | $5 \times 10^{-5}$ Torr | 1 | $Sm_{34}Fe_{66}$ | |
| | 2 | | | 2 | $Sm_{34}Fe_{66}$ | |
| | 3 | | | 3 | $Sm_{33}Fe_{67}$ | |
| | 4 | | $5 \times 10^{-5}$ Torr powder of $Al_2O_3$ | 4 | $Sm_{33}Fe_{67}$ | |
| | 5 | | | 5 | $Sm_{33}Fe_{67}$ | |
| | 6 | | | 6 | $Sm_{33}Fe_{67}$ | |

The examples 1 to 6 were measured for the void content Vc and the magnetostriction amount in the same manner as in EXAMPLE I; the sum total T of the contents of Sm forming the phases of Sm simple was determined; and further, the flexure strength was measured, thereby providing results shown in Table 5.

TABLE 5

| Magnetostrictive material | Void content Vc (%) | Magnetostriction amount (ppm) | Sum total T of Sm contents (atom %) | Flexure strength (kgf/mm²) |
|---|---|---|---|---|
| Example | | | | |
| 1 | 5 | 190 | 4.2 | 7.4 |
| 2 | 5 | 210 | 3.8 | 7.3 |
| 3 | 12 | 530 | 2.7 | 6 |
| 4 | 25 | 770 | 0.62 | 3.5 |
| 5 | 35 | 950 | 0.16 | 2.5 |
| 6 | 37 | 960 | 0.1 | 1.1 |

The examples 1 and 2 has strictly different compositions, because they include phases of Sm simple and have different sum totals T of the Sm contents as shown in Table 5. However, for convenience, they are shown in Table 4 as having the same composition. The same is true of the examples 3 to 6.

Figure 7:
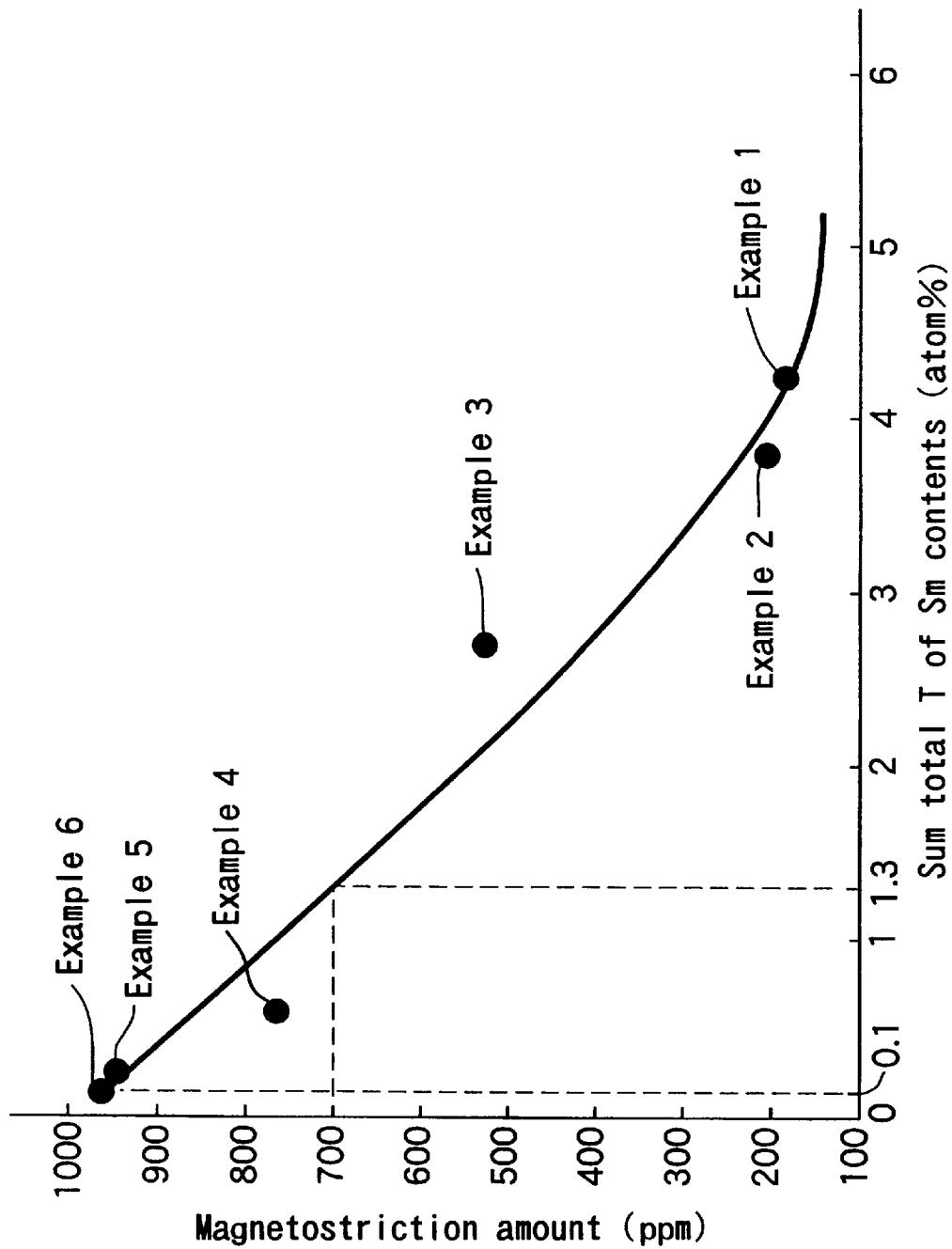
FIG. 7 is a graph illustrating the relationship between the sum total T of the Sm contents and the magnetostriction amount.
Figure 8:
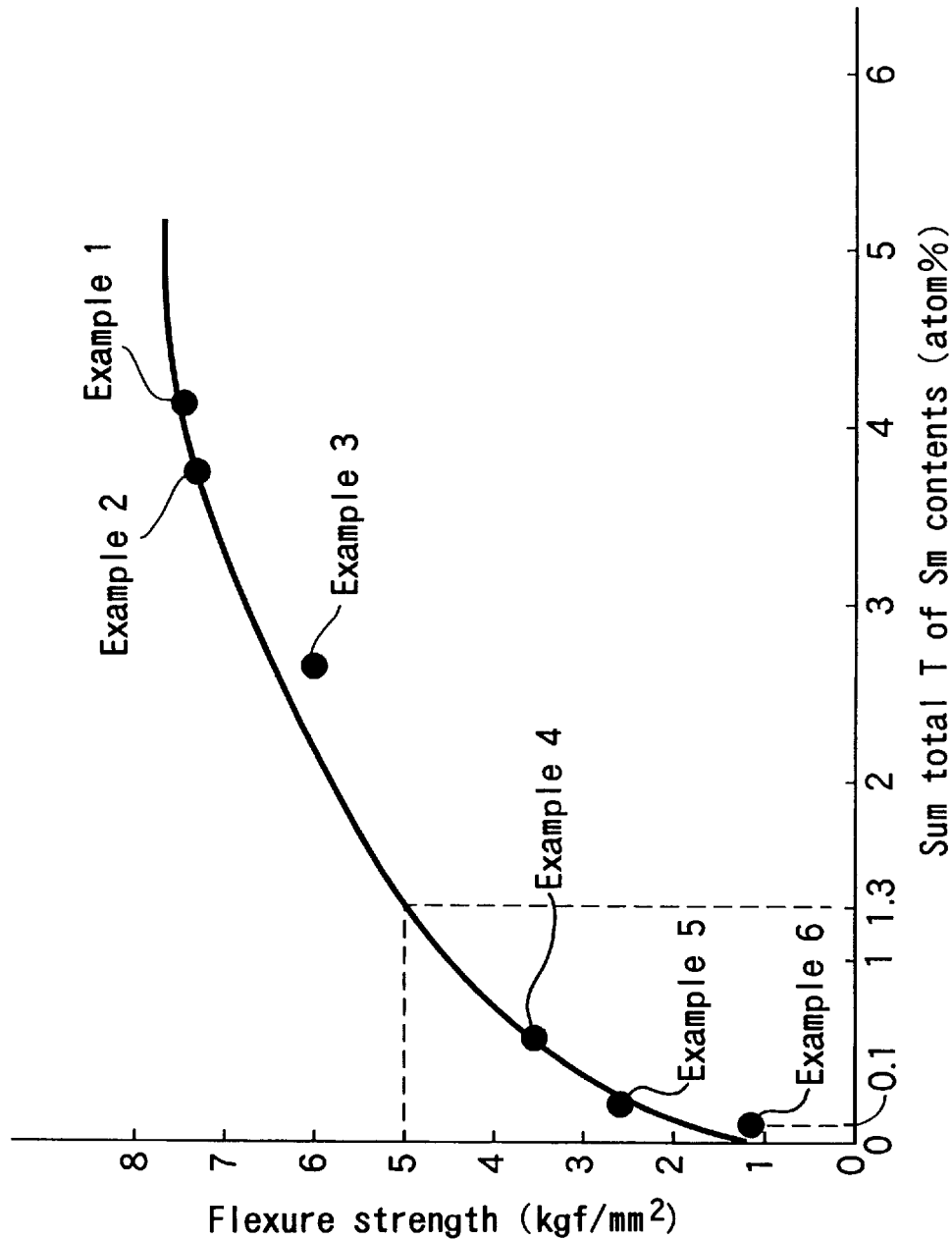
FIG. 8 is a graph illustrating the relationship between the sum total T of the Sm contents and the flexure strength.

FIG. 7 is a graph illustrating the relationship between the sum total T of the Sm contents and the magnetostriction amount taken from Table 5, and FIG. 8 is a graph illustrating the relationship between the sum total T of the Sm contents and the flexure strength also taken from Table 5.

As is apparent from FIGS. 7 and 8, as the phases of Sm simple are increased, the magnetostriction amount is decreased, but the flexure strength is enhanced. If the flexure strength is preferential in the magnetostrictive material, the upper limit value of the sum total T of the Sm contents is suitable to be equal to 5 atom %. On the other hand, if a high magnetostriction amount and a practical flexure strength are required, the sum total T of the Sm contents is suitable to be in a range of 0.1 atom % ≦ T ≦ 1.3 atom %.

Example of Use of Magnetostrictive Material

Figure 9:
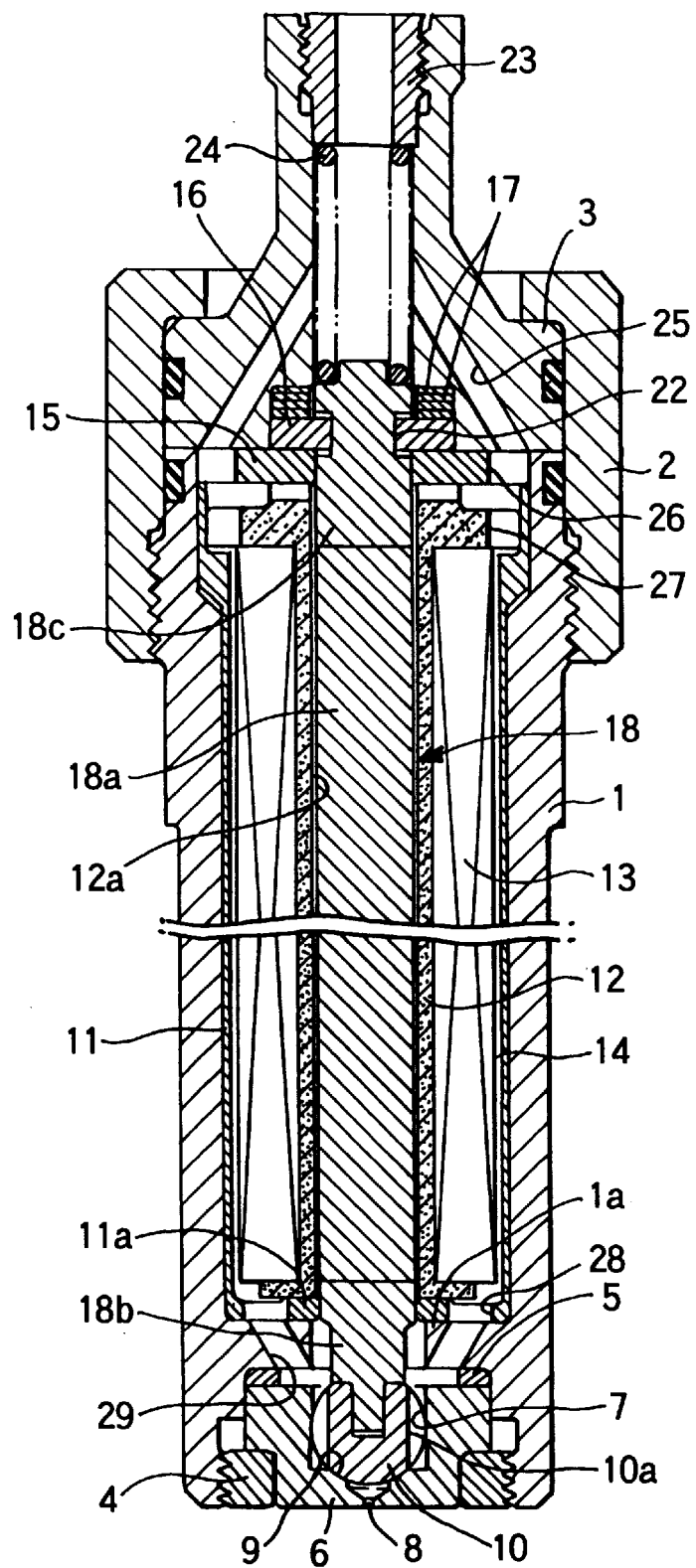
FIG. 9 is a vertical sectional view of a fuel injection valve for an engine for an automobile.

FIG. 9 shows a fuel injection valve for an engine for an automobile. An upper holder 2 is screwed into an upper portion of a cylindrical main housing 1, and an upper housing 3 is retained between an upper end of the main housing 1 and the upper holder 2. The main housing 1 has a flange 1a provided at its lower portion to protrude radially inwards. A ring-like seal member 5 and a valve seat member 6 are retained between a lower holder 4 screwed into a lower end of the main housing 1 and the flange 1a.

The valve seat member 6 includes a valve cavity 7 which is coaxial with the main housing 1 and opens toward the main housing 1. Provided in an outer end wall defining the valve cavity 7 are an injection bore 8 made through the outer end wall, and a valve seat 9 surrounding an inner end of the injection bore 8. A valve sphere 10 is slidably fitted in the valve cavity 7 in an axial direction of the main housing 1. The valve sphere 10 has a plurality of flow channels 10a extending axially of the main housing 1, so that fuel is permitted to flow through the injection bore 8 via the flow channels 10a upon opening of the fuel injection valve.

A sleeve 11 made of a magnetic material is fitted in the main housing 1 and has an end wall 11a which abuts against the flange 1a. A bobbin 12 made of a ceramics is inserted into the sleeve 11 and has a coil 13 wound therearound.

An operating shaft 18 is passed through a center bore 12a in the bobbin 12 and through the end wall 11a of the sleeve 11, and has a lower end portion press-fitted into the valve sphere 10, and an upper portion slidably supported on a ring-like bearing member 15. The bearing member 15 is retained between an upper end of the sleeve 11 as well as an upper flange of the bobbin 12 and the upper housing 3. A ring-like limiting member 16 with its inner periphery fitted in an annular groove 22 in the operating shaft 18 and a plurality of ring-like spacers 17 are retained between the bearing member 15 and the upper housing 3. The limiting member 16 limits the axial movement of the operating shaft 18. A compression spring 24 is mounted between a cylindrical spring receiving member 23 screwed into an upper end of the upper housing 3 and an upper end of the operating shaft 18.

The upper housing 3 is provided with a passage 25 which leads to a fuel supply source (not shown) through the inside of the spring receiving member 23. The passage 25 leads to the valve cavity 7 via a notch 26 in the bearing member 15, a notch 27 existing in the upper flange of the bobbin 12, a cylindrical passage 14 defined between an outer peripheral surface of the coil 13 and an inner peripheral surface of the sleeve 11, a passage 28 defined in the end wall 11a of the sleeve 11 and a passage 29 in the flange 1a.

The operating shaft 18 is comprised of a central shaft portion 18a made of a magnetostrictive material and disposed in the center bore 12a in the bobbin 12, a lower shaft portion 18b made of a magnetic material, which is coaxially coupled at its upper end to a lower end of the central shaft portion 18a, and press-fitted at its lower end into the valve sphere 10, and an upper shaft portion 18c made of a magnetic material, which is coaxially coupled at its lower end to an upper end of the central shaft portion 18a, and has an annular groove 22.

When the coil 13 is in its deenergized state in a such fuel injection valve, the operating shaft 18 is in a position in which the valve sphere 10 has been seated on the valve seat 9 by a spring force of the compression spring 24, so that the injection bore 8 has been closed. On the other hand, when the coil 13 is energized, the central shaft portion 18a made of the magnetostrictive material in the operating shaft 18 is axially contracted and hence, the valve sphere 10 is moved away from the valve seat 9 to open the injection bore 8, thereby permitting the fuel to be injected through the injection bore 8.

In the fuel injection valve, the annular groove 22 and the limiting member 16, when the injection valve is opened, are mated to each other by the spring force of the spring 24, and when the fuel injection valve is closed, a shock produced upon seating of the valve sphere 10 onto the valve seat 9 acts on an end of the operating shaft 18 adjacent the valve sphere 10. With this point in view, the opposite ends of the operating shaft 18 are formed from the magnetic material, rather than the formation of the entire operating shaft 18 from the magnetostrictive material, thereby preventing the cracking and breaking to be produced in the central shaft portion 18a made of the magnetostrictive material. This provides an enhanced durability to the shock acting on the operating shaft 18.

The following features (1) to (3) and the like are required for the magnetic material forming the lower and upper shaft portions 18b and 18c: (1) the magnetic material has a high toughness; (2) at the thermal treating step carried out in the production of the central shaft portion 18a and thus the magnetostrictive material, the liquid phase diffusion bonding of the magnetostrictive material in a semi-molten state with the magnetic material can be produced; and (3) the magnetic material has an excellent corrosion resistance and an excellent workability. The magnetic material meeting such requirements includes, for example, an electromagnetic stainless steel.

For example, the examples 2 to 5 shown in FIGS. 5 and 6 are used as the magnetostrictive material forming the central shaft portion 18a. The examples 2 to 5 have a compression strength required for the central shaft portion 18a of the operating shaft 18 in the fuel injection valve, e.g., a compression strength larger than 7 kgf/mm².

When a magnetic field is applied as described above, the examples 2 to 5 are deformed with a variation in volume. Therefore, it is unnecessary to ensure an extra unoccupied space around the central shaft portion 18a, which is effective for providing a reduction in size of the fuel injection valve. In contrast, if the central shaft portion 18a is formed from a magnetostrictive material which is not varied in volume, the central shaft portion 18a, when it is axially contracted, is expanded radially outwards in a corresponding amount. Therefore, it is necessary to provide an extra unoccupied space corresponding to such expanded amount around the central shaft portion 18a, resulting in a corresponding increase in size of the fuel injection valve.

An operating shaft 18 having a central shaft portion 18a formed from each one of the examples 1 to 5 and 7 to 9 of the magnetostrictive material in EXAMPLE I and upper and lower shaft portions 18c and 18b formed from a electromagnetic stainless steel was assembled into a fuel injection valve of the above-described type, and the durability of the operating shaft 18 and the consumed electric power were examined to provide results given in Table 6. The durability is "passable" when a variation in lift amount after 100,000,000 runs of the operation of the fuel injection valve is within ±2.5%, and the consumed electric power is a value comparable to example 3 when the consumed electric power for the operating shaft 18 made from the example 3 is defined to be "1". The operating shaft 18 made using the example 9 was broken during the test because of the lack of mechanical strength and hence, the consumed electric power is unmeasurable.

TABLE 6

| Operating shaft | | Magnetostrictive material used | Durability | Consumed electric power |
|---|---|---|---|---|
| Example | 1 | example 1 | passable | 2 |
|  | 2 | example 2 | passable | 1.2 |
|  | 3 | example 3 | passable | 1 |
|  | 4 | example 4 | passable | 1 |
|  | 5 | example 5 | passable | 1.2 |
|  | 7 | example 7 | passable | 1 |

TABLE 6-continued

| Operating shaft | Magnetostrictive material used | Durability | Consumed electric power |
|---|---|---|---|
| 8 | example 8 | passable | 1.2 |
| 9 | example 9 | failure | — |

As is apparent from Table 6, any of the examples 2 to 5 of the operating shaft using the examples 2 to 5 of the magnetostrictive material have an excellent durability, and the consumed electric power is small. For the example 1 of the operating shaft, the magnetostriction amount is as small as 600 ppm, and the consumed electric power is large. For the examples 7 and 8 of the operating shaft, the durability and the consumed electric power offer no problem, but the magnetostriction amounts are as small as 670 ppm and 610 ppm, respectively.

The magnetostriction amount of the example 3 of the operating shaft is 870 ppm, which is 45% larger than the magnetostriction amount of the example 1 of the operating shaft equal to 600 ppm. The amount of the stroke of the operating shaft is determined by a magnetostriction amount at the time when a magnetic field is applied. Therefore, the increase in the magnetostriction amount means that the amount of the stroke of the operating shaft can be increased by 45%.

According to the present invention, it is possible to provide a magnetostrictive material which has a practical mechanical strength and remarkably increased magnetostriction amount by forming the magnetostrictive material in the above-described manner.

In addition, according to the present invention, it is possible to provide a producing process which is capable of easily producing a magnetostrictive material of the above-described type by employing the means specified as described above.

What is claimed is:

1. A magnetostrictive material including a rare earth element and a transition metal element, wherein said magnetostrictive material has a plurality of spherical voids dispersed in an entire volume thereof, a void content Vc by volume being in a range of $10\% \leq Vc \leq 40\%$.

2. A magnetostrictive material including Sm and a transition metal element, wherein said magnetostrictive material has a plurality of spherical voids dispersed in an entire volume thereof, a void content Vc by volume being in a range of $10\% \leq Vc \leq 40\%$.

3. A magnetostrictive material according to claim 2, wherein said material has a plurality of phases of Sm dispersed in the entire volume thereof, a sum total T of contents of Sm forming all of the plurality of phases of Sm being in a range of $T \leq 5$ atom %.

4. A magnetostrictive material according to claim 2, wherein said material has a plurality of phases of Sm dispersed in the entire volume thereof, a sum total T of contents of Sm forming all of the plurality of phases of Sm being in a range of 0.1 atom % $\leq T \leq 1.3$ atom %.

5. A process for producing a magnetostrictive material, comprising the steps of producing by casting a blank including a transition metal element and an excessive amount of Sm larger than a final amount of Sm by an extra amount of Sm, and subjecting the blank to a thermal treatment in which said extra amount of Sm is removed to form a plurality of spherical voids (v).

6. A process for producing a magnetostrictive material according to claim 5, wherein said transition metal element is Fe, and said blank is comprised of a plurality of phases of Sm and at least one phase of $SmFe_2$.

7. A process for producing a magnetostrictive material according to claim 6, wherein said blank includes at least one of: at least one phase of $SmFe_3$; and at least one phase of $Sm_2Fe_{17}$.

8. A process for producing a magnetostrictive material according to claim 5, 6 or 7, wherein in said thermal treatment, a powder of $Al_2O_3$ for assisting in the removal of Sm is brought into contact with said blank.

9. A process for producing a magnetostrictive material according to claim 5, 6 or 7, wherein said thermal treatment is effective for producing a void content Vc by volume throughout the blank in a range of $10\% \leq Vc \leq 40\%$.

10. A process for producing a magnetostrictive material according to claim 5, 6 or 7, wherein said thermal treatment includes heating the blank at a temperature increasing rate of substantially 400° C./hr to a treatment temperature of 800° C. for a treatment time in a range of 3 hours to 6 hours, and then cooling the blank at a cooling rate of substantially 100° C./hr.

11. A process for producing a magnetostrictive material according to claim 10, wherein said thermal treatment is conducted in an Argon atmosphere at less than atmospheric pressure.

12. A process for producing a magnetostrictive material according to claim 11, wherein said Argon atmosphere is at a pressure in a range of $1 \times 10^{-2}$ Torr to $5 \times 10^{-5}$ Torr.

13. A process for producing a magnetostrictive material according to claim 5, 6 or 7, wherein said blank, after the casting step, includes, in a non-equilibrium state, a phase of Sm, a phase of $SmFe_2$ and a phase of $SmFe_3$.

14. A process for producing a magnetostrictive material according to claim 13, wherein the phase of $SmFe_2$ exists around each of a plurality of phases of $SmFe_3$, and the phase of Sm fills spaces between adjacent phases of $SmFe_2$.

15. A magnetostrictive material according to claim 1 or 2, wherein said transition metal element is Fe.

16. A magnetostrictive material according to claim 1 or 2, wherein said material has a magnetostriction amount of at least 800 ppm.

17. A magnetostrictive material according to claim 1 or 2, wherein said material has a compressive strength of at least 15 kgf/mm².

\* \* \* \* \*